United States Patent [19]

Taura

[11] Patent Number: 5,483,494
[45] Date of Patent: Jan. 9, 1996

[54] NONVOLATILE SEMICONDUCTOR MEMORY DEVICE HAVING A REDUCED DELAY IN READING DATA AFTER CHANGING FROM STANDBY TO AN OPERATION MODE

[75] Inventor: Tadayuki Taura, Yokohama, Japan

[73] Assignee: Kabushiki Kaisha Toshiba, Kanagawa, Japan

[21] Appl. No.: 225,182

[22] Filed: Apr. 7, 1994

[30] Foreign Application Priority Data

Apr. 7, 1993 [JP] Japan .................................. 5-080651

[51] Int. Cl.$^6$ .................................................. G11C 16/06
[52] U.S. Cl. .......................... 365/185.21; 365/189.11; 365/189.07; 365/189.09; 365/185.12; 327/53; 327/56
[58] Field of Search .................. 365/189.11, 189.07, 365/189.09, 202, 203, 210, 230.03, 185, 190, 204; 307/530; 327/52, 53–57

[56] References Cited

U.S. PATENT DOCUMENTS

| | | | |
|---|---|---|---|
| 4,692,902 | 9/1987 | Tanaka et al. | 365/210 |
| 4,974,207 | 11/1990 | Hashimoto | 365/210 |
| 5,138,579 | 8/1992 | Tatsumi et al. | 365/203 |
| 5,243,573 | 9/1993 | Makihara et al. | 365/205 |
| 5,245,570 | 9/1993 | Fazio et al. | 365/185 |
| 5,293,345 | 3/1994 | Iwahashhi | 365/210 |

*Primary Examiner*—David C. Nelms
*Assistant Examiner*—Andrew Q. Tran
*Attorney, Agent, or Firm*—Loeb & Loeb

[57] ABSTRACT

A nonvolatile memory device includes a matrix array of transistors. A read potential generation circuit provides a potential to a selected transistor and generates a read potential in accordance with the flow of current which indicates the data storage state of the transistor. A reference potential generation circuit provides a potential to a selected dummy transistor and generates a reference potential based on the current which flows through the dummy transistor. The memory device incorporates one or more strategies to prevent the relative magnitudes of the read potential and reference potential from being erroneously inverted immediately after the nonvolatile memory is switched from standby to an operational mode. A reference potential decreasing circuit incorporated within the reference potential generation circuit is activated for a predetermined time period after chip enable. Alternatively, a read potential increasing circuit is coupled to the output of the read potential generating circuit and is activated for a predetermined time period after chip enable. Both a reference potential decreasing circuit and a read potential increasing circuit can be included in the nonvolatile memory circuit.

10 Claims, 17 Drawing Sheets

NONVOLATILE SEMICONDUCTOR MEMORY DEVICE HAVING A REDUCED DELAY IN READING DATA AFTER CHANGING FROM STANDBY TO AN OPERATION MODE

BACKGROUND OF THE INVENTION

The present invention relates to a nonvolatile semiconductor memory device capable of erasing and writing data after changing condition from standby to operation.

A so-called UV-EPROM is an ultraviolet-erasable and programmable read only memory in which data are erased by an irradiation of ultraviolet rays and electrically written again. A so-called EEPROM is an electrically erasable and programmable read only memory in which data are electrically erased and written. In such the UV-EPROM and EEPROM, data of "1" or "0" are read out on the basis of a determination result of comparing a read potential $V_S$ (called as $V_{S1}$ or $V_{S0}$ corresponding to the necessity) corresponding a level of "1" or "0" of cell data with a reference potential (called as $V_R$) in a sense amplifier circuit when the data are read out.

FIG. 1A is a plan view showing a pattern of a nonvolatile transistor which is used as memory cell in the EEPROM electrically erasing data, and FIG. 1B is a sectional view showing a section cut by a line 1B—1B in FIG. 1A.

The transistor has a double poly-crystal silicon layer construction, in which a floating gate 21 is formed by a first poly-crystal silicon layer and a control gate 23 is constituted by a second poly-crystal silicon layer. In FIGS. 1A and 1B, numeral 24 denotes a source, 25 denotes a drain, 27 denotes a silicon substrate, 22 denotes a contact hole, and 28 denotes a data line which is formed by aluminum (Al) and connected through the contact hole 22 to the drain 25. There will be briefly described below data writing, reading and erasing operation of the memory cell having the above construction.

Writing operation is performed by implanting a hot electron into the floating gate under the condition that a drain potential is set to 8 V, the control gate potential is 12 V and a source voltage is 0 V. Reading operation is performed under the condition that the control gate potential is set to 5 V, the drain potential is 1 V and the source potential is 0 V. At this time, very few cell current flows between the source and drain when storage data of the memory cell is "0" (a write mode), and a cell current having about 100 µA flows between the source and drain when the storage data is "1" (an erasing mode).

Erasing operation is performed under the condition that the control gate potential is 0 V, the drain potential is floating and the source potential is high such as 12 V. At this time, an electron in the floating gate is extracted to the source by means of a tunnel effect.

There is described a total configuration of the conventional nonvolatile semiconductor memory device including the above-mentioned nonvolatile memory cell and sense amplifier with reference to FIG. 2. In FIG. 2, the memory device comprises a memory cell array 1 in which a plurality of memory cells are arranged in a matrix shape, a dummy cell array 3 comprised of a dummy cell having the same construction as the plurality of memory cells along a line in the column direction of the memory cell array 1, a read potential generation circuit 6 for supplying a predetermined potential a memory cell selected at reading data and for generating a read potential corresponding to a cell current in the memory cell selected, a reference potential generation circuit 8 for supplying a predetermined drain potential to a drain of the dummy cell selected at reading data and for generating a reference potential at reading data, an equalizing circuit 7 for equalizing corresponding nodes in the read and reference potential generation circuits 6 and 8, and a current mirror type amplifier circuit 10 for comparing the read potential and the reference potential respectively supplied from the read and reference potentials generation circuits 6 and 8 and for transmitting a potential corresponding to the data of the selected memory cell to an output circuit (not shown in FIG. 2).

The read potential generation circuit 6, the equalizing circuit 7, the reference potential generation circuit 8 and current mirror type amplifier circuit 10 constitute the conventional sense amplifier which is materially configured in FIG. 3, for example.

In FIG. 3, numerals P1–P23 denote P-channel enhancement transistors, D1–D12 denote N-channel depression transistors, N1–N24 denote N-channel enhancement transistors, and I1–I12 denote N-channel transistors each having a threshold value near 0 volt (V). In FIG. 3, the read potential generation circuit 6 comprises the transistors P1, D1 and I1 which are connected in series one another, the transistor N1, the transistors P2, D2 and I2 which are connected in series one another, the transistors N2, N3, N4, N5, N6, N7 and N8, and the transistors P3 and P4 which are connected in series each other. A driving voltage $V_{CC}$ is supplied to sources of the transistors P1, P2 and P3, and sources of the transistors N1, N2, N4, N6, N8, I1 and I2 are grounded to the earth. A gate of the transistor D1 is connected to a junction point between the transistors D1 and I1. A drain of the transistor N1 is connected to a junction point between the transistors D1 and I1. A gate of the transistor D2 is connected to a junction point between D2 and I2. A drain of the transistor N2 is connected to a junction point between the transistors D2 and I2. A driving voltage $V_{CC}$ is supplied to a drain of the transistor N3 of which a gate is connected to the junction point between the transistors D1 and I1 and a source is connected to a node $ND_1$. A drain of the transistor N4 is connected to the node $ND_1$ and issues a minute current (for example, about 1 µA) by a leak control signal $S_{CL}$ supplied to a gate thereof in order to prevent a data line from an overcharge when data "0" are read out for a long time. The transistor N5 has a drain connected to the node $ND_1$ and a source connected to one end of a transfer gate provided between the read potential generation circuit 6 and the memory cell array 1, and is turned on only when the data are read. A drain of the transistor N6 is connected to the node $ND_1$, and a drain of the transistor N8 is connected to a node $ND_2$. The node $ND_2$ is connected to the node $ND_1$ through the transistor N7. A driving voltage $V_{CC}$ is supplied a source of the transistor P3, and gate and drain of the transistor P4 are connected to the node $ND_2$. Each gate of the transistors P1, P2, P3, N1, N2, N6 and N8 is supplied with a first control signal $S_1$ which becomes an "L" at reading data. Furthermore, a third control signal $*S_3$ is supplied to a gate of the transistor N5.

In the read potential generation circuit 6, a series circuit of the transistors P1, D1 and I1, a series circuit of the transistors P2, D2 and I2, and the transistors N3 and N7 keep drain potentials of the memory cells to a optimum value such as 1V, and transmit a read potential $V_S$ corresponding to the data of the selected memory cell from the node $ND_2$ to the current mirror amplifier circuit 10. The transistor P4 supplies a constant current as a load transistor of the node $ND_2$.

Here, the read potential is described. When the data of the memory cell selected from the memory cell array 1 are "0" level, no current flows in the memory cell, and a potential such as 3 V is charged in the node $ND_2$ through the transistors P3 and P4. When the data of the memory cell selected are "1" level, since a cell current such as 100 μA flows in the memory cell, a potential $V_{SA1}$ of the node $ND_2$ becomes about 1 V, for example, in accordance with a voltage divided ratio between the load transistor P4 and the selected memory cell.

On the other hand, the reference potential generation circuit 8 is a copy circuit of the read potential generation circuit 6, and comprises transistors P11, D11 and I11 connected in series one another, transistors P12, D12 and I12 connected in series one another, transistors N12, N13, N14, N15, N16, N17 and N18, and transistors P13 and P14 connected in series each other. Namely, the transistor P11 of the reference potential generation circuit 8 corresponds to the transistor P1 of the read potential generation circuit 6. A gate of the transistor N15 is supplied with a fourth control signal $*S_4$.

The reference potential generation circuit 8 is connected through the transistor N15 and a dummy data line $DL_R$ to the dummy cell 3, and the transistors P11, D11, I11, P12, D12, I12, N13 and N17 keep a drain potential of the dummy cell 3 to a predetermined potential. The transistor P14 supplies a constant current having a reference potential $V_R$. A node $ND_4$ issuing the reference potential is connected to the dummy data line $DL_R$ through the transistors N17 and N15. Since dummy cells DC1–DCm are the cells in erasing mode, a cell current of 100 μA flows at reading the data. The reference potential $V_R$ at this time becomes a value being a current ratio between the load transistor P14 and the selected dummy cell. on the other hand, the reference potential $V_R$ needs to be an intermediate potential between the read potential $V_S$ when the data "0" are stored in the memory cell CAij and the read potential $V_S$ when the data "1" is stored. Accordingly, the load transistor P14 of the reference potential generation circuit 8 has a predetermined current amount more than that of the corresponding transistor P4 of the read potential generation circuit 6.

The current mirror type amplifier circuit 10 has a differential amplifier pair including transistors P21, P22, P23, N22 and N23, a transistor N24, and inverters IV1, IV2 and IV3. A gate of the transistor P23 is connected to the node $ND_2$ issuing the read potential $V_S$, and a gate of the transistor P23 is connected to the node $ND_4$ issuing the reference potential $V_R$. A drain of the transistor N24 is connected to drains of the transistors P22 and N22, and a source of the transistor N24 is grounded to the earth. The inverters IV1, IV2 and IV3 are connected in series one another, and inverts a potential of a junction point between the transistors P22 and N22 to output it to an output circuit. Accordingly, the read potential $V_S$ and the reference potential $V_R$ are supplied to the transistors P22 and P23, respectively, and an output $D_B$ is supplied to the output circuit 12 according to an amount of these values. The output $D_B$ becomes "1" when the data "0" are read, and does "0" when the data "1" are read.

The nodes $ND_1$ and $ND_3$ are connected by the transistor N20, the nodes $ND_2$ and $ND_4$ are connected by the transfer gate comprised of the transistors P20 and N21, and these transistors N20, P20 and N21 constitute the equalizing circuit 7. The equalizing circuit 7 comprises the transistor N20 for equalizing the nodes $ND_1$ and $ND_3$, and the transistors N21 and P20 for equalizing the nodes $ND_2$ and $ND_4$.

In the semiconductor memory device having the above configuration, during a standby where the data are not read, the first control signal $S_1$ being "H" during the standby is supplied to gates of the transistors N1. N2, N6, and N8 of the read potential generation circuit 6 and gates of the transistors N11, N12, N16, and N18 of the reference potential generation circuit 8 in order to suppress a power consumption, so that all nodes $ND_1$, $ND_2$, $ND_3$ and $ND_4$ are grounded to the earth. At this time, an inverted signal $*S_2$, which is generated by inversion of the second control signal supplied to the gates of the transistors P21 and N24 of the current mirror circuit 10 and the gates of the transistors n20 and N21, is "H" level, and the second control signal supplied to the gate of the transistor P20 is "L" level.

In the case that there is a condition changed from a standby mode to a reading mode, changes of several signals $*CE$, $S_1$, WL, $*S_2, D_0$, $V_S$ and $V_R$ are shown in FIG. 4. In FIG. 4, a change of a first control signal $S_1$ from "H" to "L" by receiving a chip enable signal $*CE$ causes the read potential generation circuit 6 and reference potential generation circuit 8 to be an operation mode, thereby outputting data $D_0$ from the current mirror amplifier circuit 10 to a not-shown output circuit. Since a potential WL of a word line needs an enough time to be risen by means of a capacity of the memory cells, it is impossible to normally read the data during a rising time interval. On the other hand, since a current flows in a data line by charging a drain potential of the transistor P4 despite of data the memory cell, a level of the read potential $V_S$ is low. In the same manner, the dummy data line $DL_R$ is initially charged. Since the current amount of the transistor P4 is smaller than that of the transistor P14, a charge on the side of the memory cells needs a longer time than a charge on the side of the reference potential. In order to shorten a charge time on the memory cell side, when a predetermined time passes after the control signal $S_1$ changes from "H" to "L", the signal $*S_2$ changes from "H" to "L" and the signal $S_2$ changes from "L" to "H", thereby equalizing both levels between the nodes $ND_2$ and $ND_4$ and between nodes $ND_1$ and $ND_3$, respectively, so as to quicken the initial charge. After that, when the signal $*S_2$ changes from "L" to "H", the current mirror amplifier circuit 10 is driven, thereby achieving a high speed reading with respect to stored data by outputting cell data.

In the conventional nonvolatile semiconductor memory device having the above construction, in the case of reading the data "0" when the chip enable signal $*CE$ changes from "H" to "L", if the signals $S_2$ and $*S_2$ change during a time period insufficient to initially charge a potential to the data line, the levels of the reference potential $V_S$ and the reference potential $V_R$ are respectively inverted (during times $t_1$ and $t_2$ in FIG. 4). Therefore, operation changes from "1" reading to "0" reading, thereby resulting a problem of the delay of reading the data.

Furthermore, in order to quicken the initial reading, the node $ND_2$ of the read potential generation circuit 6 is equalized to the node $ND_4$ of the reference potential generation circuit 8. Therefore, when there are provided a plurality of the reference potential generation circuits 6, it is necessary to provide a same number of the reference potential generation circuits 8 and dummy cell arrays 3, thereby resulting a problem of increasing an area of chips.

SUMMARY OF THE INVENTION

The present invention is conceived under the above condition, and has an object to provide a nonvolatile semiconductor memory device capable of performing a high-speed reading when the device changes from a standby mode to a operation mode and capable of preventing an increase of a chip area as small as possible.

A nonvolatile semiconductor device according to a first invention comprises a memory cell array having an arrangement of a matrix by memory cells comprised of nonvolatile transistors, a dummy cell having a transistor construction, read potential generation means for supplying a predetermined potential to a selected memory cell and for generating a read potential corresponding to data stored in the selected memory cell on the basis of a current flowing in the selected memory cell, reference potential generation means for supplying a predetermined potential to the dummy cell and for generating a reference potential on the basis of a current flowing in the dummy cell, reference potential decrease means for decreasing the reference potential for a constant time when a first predetermined time passes after a change from a standby mode to an operation mode, and amplifier means for comparing the read potential and the reference potential after a second predetermined time passes after the change from the standby mode to the operation mode and for issuing an output being amplified corresponding a comparison result.

A nonvolatile semiconductor device according to a second invention comprises a memory cell having an arrangement of a matrix by memory cells comprised of nonvolatile transistors, a dummy cell having a transistor construction, read potential generation means for supplying a predetermined potential to a selected memory cell and for generating a read potential corresponding to data stored in the selected memory cell on the basis of a current flowing in the selected memory cell, reference potential generation means for supplying a predetermined potential to the dummy cell and for generating a reference potential on the basis of a current flowing in the dummy cell, read potential initial charge means for increasing the read potential for a constant time when a first predetermined time passes after a change from a standby mode to an operation mode, and amplifier means for comparing the read potential and the reference potential after a second predetermined time passes after the change from the standby mode to the operation mode and for issuing an output being amplified corresponding a comparison result.

By the nonvolatile semiconductor memory device according to the first invention having the above construction, when the first predetermined time passes after the memory device starts operation from the standby mode, the reference potential decrease means reduces the reference potential during the constant time. By this, it is possible to shorten the delay of reading operation caused by an initial charge as little as possible. Furthermore, since there is no equalization between the read potential side and the reference potential side in this invention different from the conventional device, a plurality of read potential generation means can commonly use the same reference potential generation means, thereby resulting a chip area as small as possible.

By the nonvolatile semiconductor memory device according to the second invention having the above construction, when the first predetermined time passes after the memory device starts operation from the standby mode, the read potential increase means increases the read potential (a rapid charge) during the constant time. By this, it is possible to shorten the delay of reading operation caused by an initial charge as little as possible. Furthermore, since there is no equalization between the read potential side and the reference potential side in this invention different from the conventional device, a plurality of read potential generation means can commonly use the same reference potential generation means, thereby resulting a chip area as small as possible.

As described above, even though the initial charge to the data line is insufficient, since the nonvolatile semiconductor memory device according to the present invention sets both the potentials in the manner that the reference potential is sufficient to be lower than the read potential during a first predetermined time passing from the standby mode to the operation mode, the reference potential generation circuit can be commonly used, thereby reducing the entire chip area as small as possible and reading the data in high-speed when the memory device changes from the standby mode to the operation mode.

DETAILED DESCRIPTION OF THE PREFERRED EMBODIMENT

There will now be described in detail preferred embodiments of a nonvolatile semiconductor memory device (hereinunder also called as a memory device) in reference with FIGS. 5–17.

Figure 2:
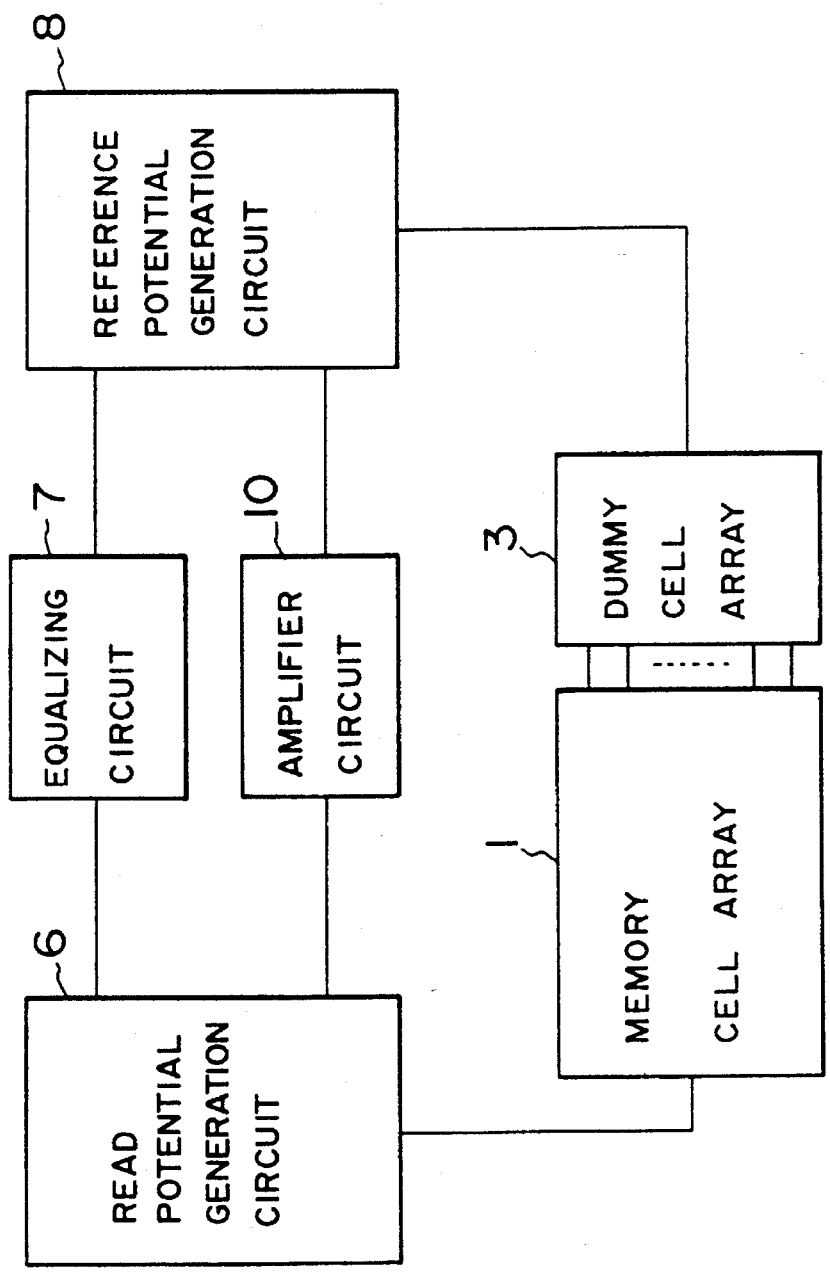
FIG. 2 is a block diagram showing a schematic configuration of the conventional nonvolatile semiconductor memory device.

First, a memory device according to a first embodiment of the present invention is described in reference with FIGS. 5–8. The memory device according to the first embodiment is the device in which the equalizing circuit 7 of the conventional memory device shown in FIG. 2 is eliminated and reference potential decrease means (circuit) 9 is added to the conventional memory. Other components such as the memory cell array 1, dummy cell array 3, read potential generation circuit 6, reference potential generation circuit 8, and a current mirror type amplifier circuit 10 are the same as those of the conventional device shown in FIG. 2.

Figure 3:
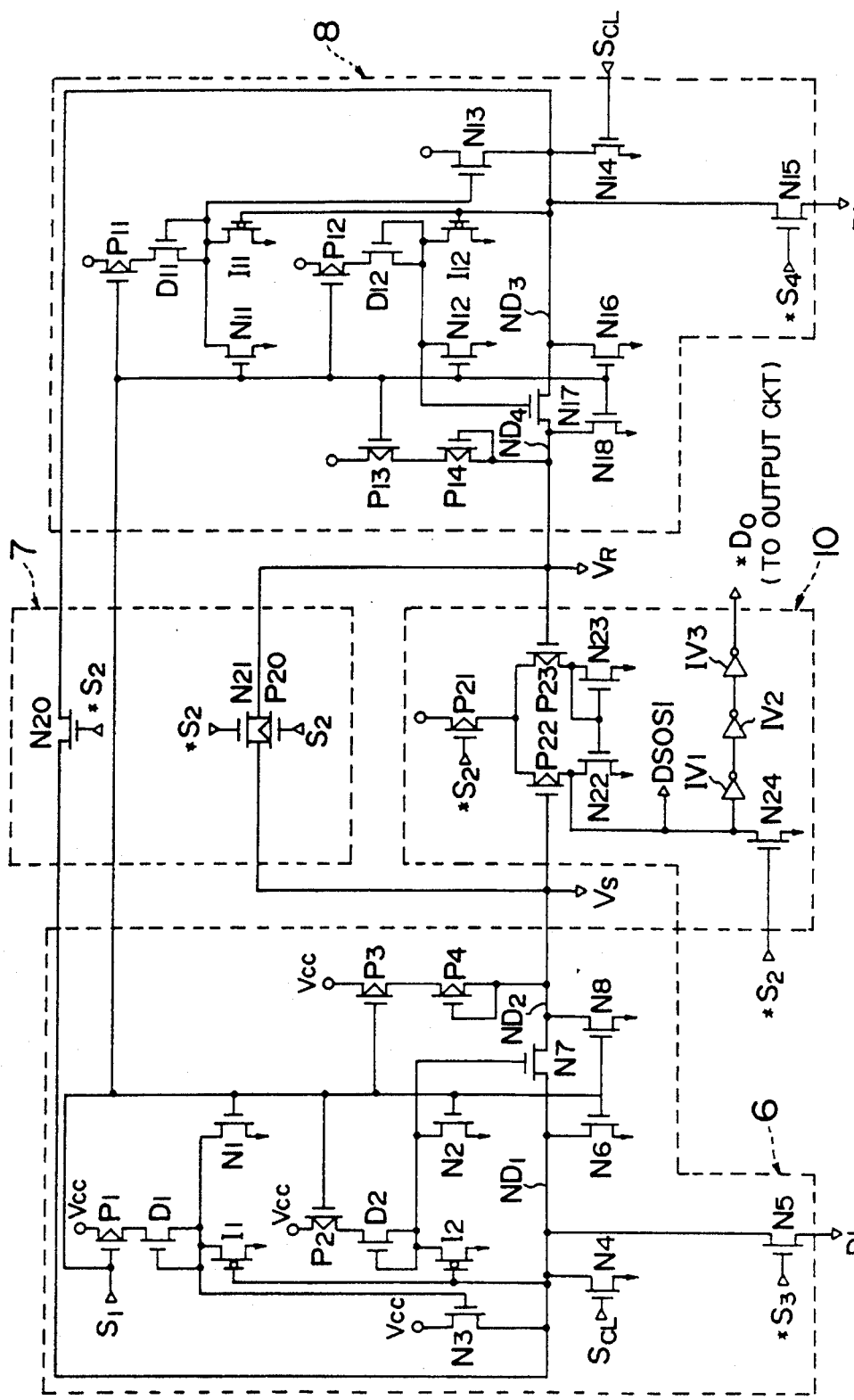
FIG. 3 is a circuit diagram showing a detailed configuration of the conventional nonvolatile semiconductor memory device.
Figure 4:
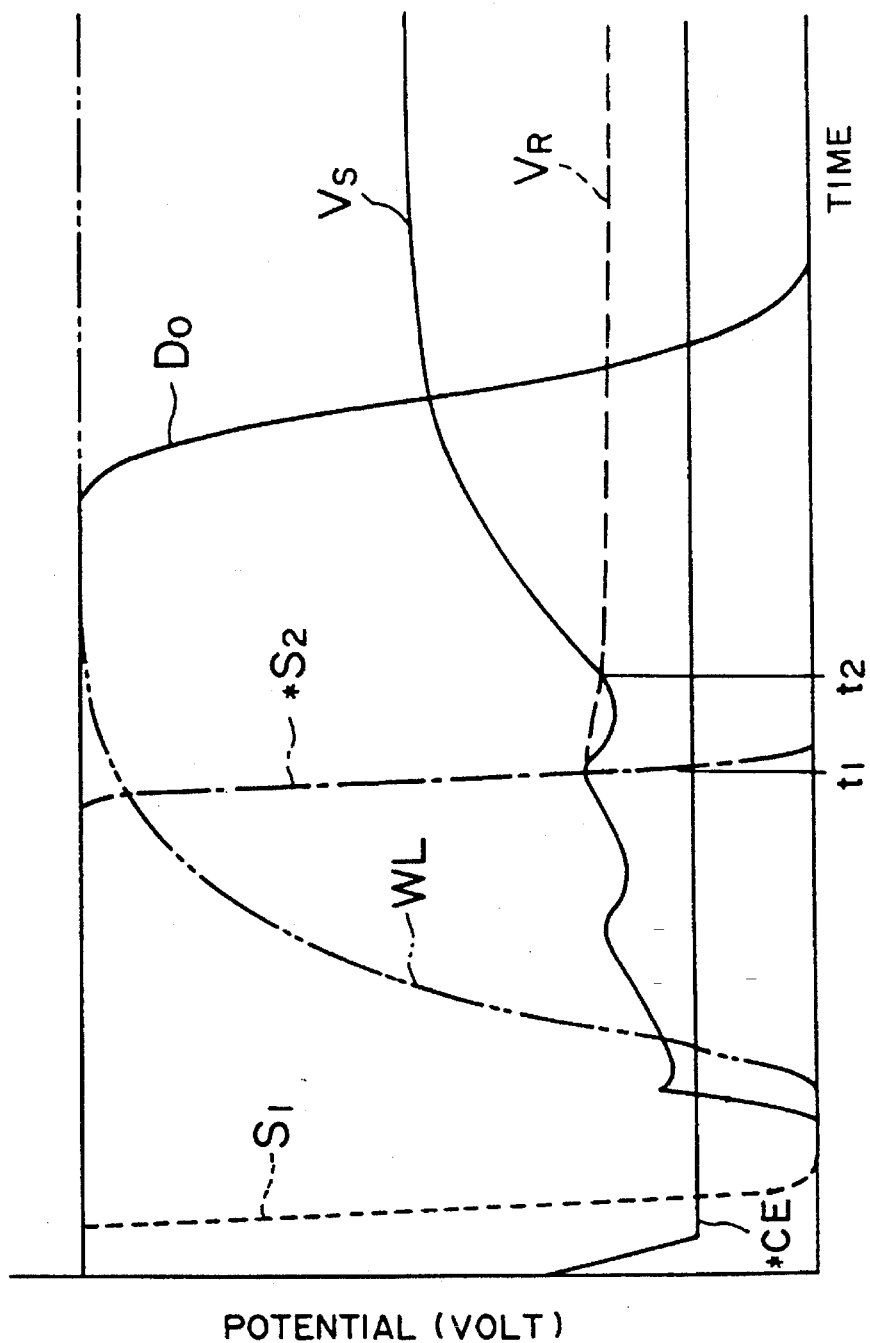
FIG. 4 is a timing chart for explaining operation of the conventional nonvolatile semiconductor memory device.
Figure 5:
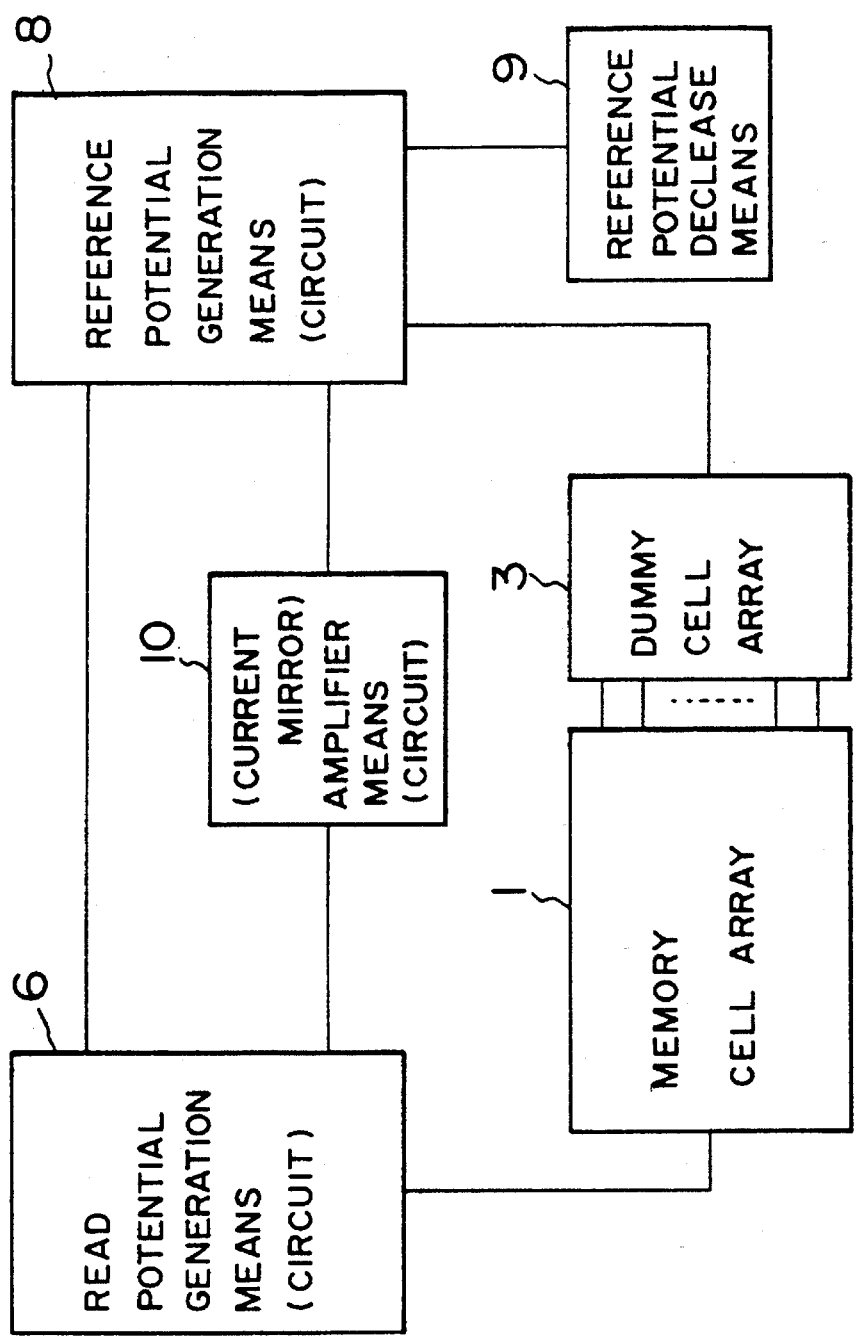
FIG. 5 is a block diagram showing a schematic configuration of a nonvolatile semiconductor memory device according to a first embodiment of the present invention.
Figure 6:
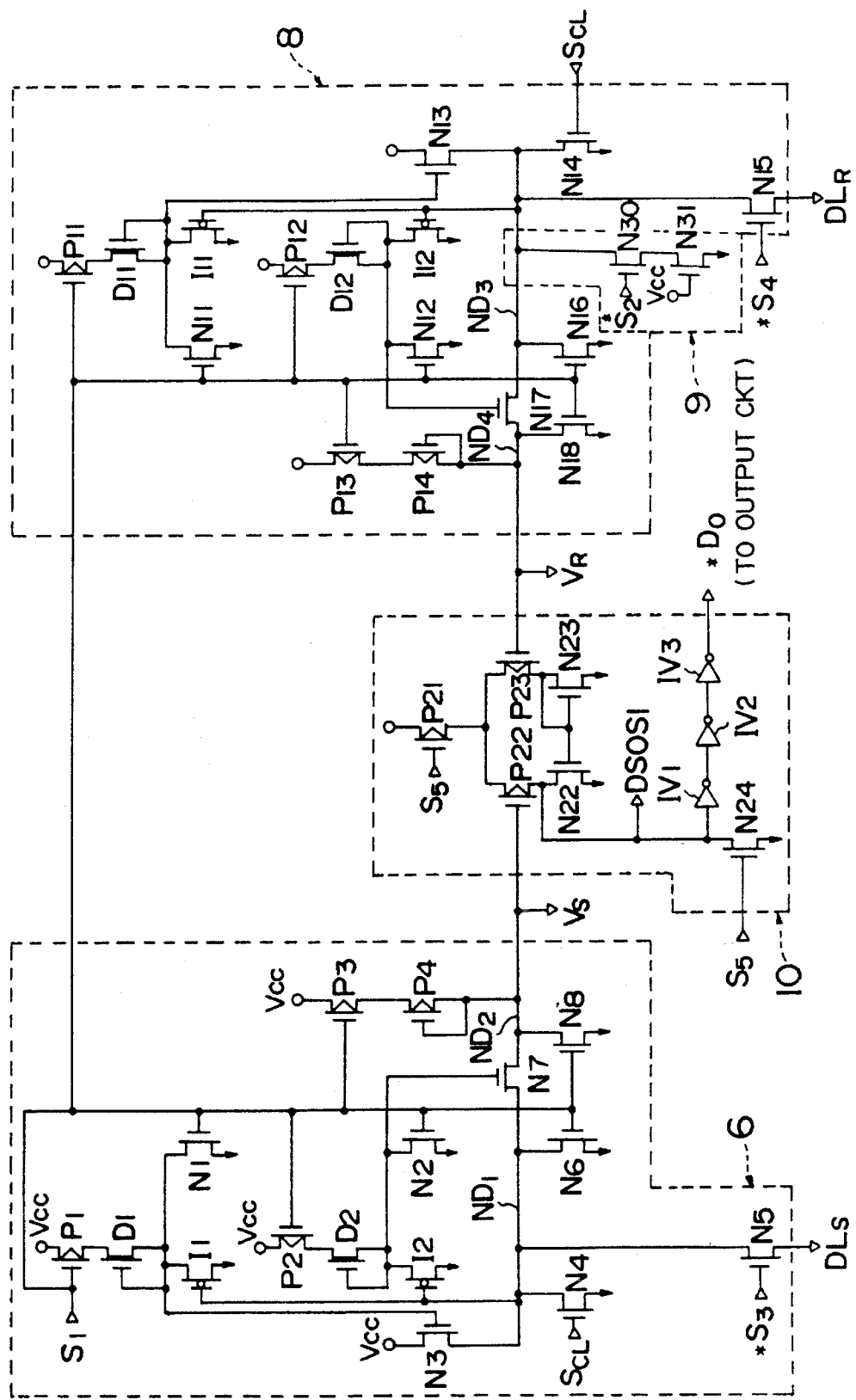
FIG. 6 is a circuit diagram showing a detailed configuration of the nonvolatile semiconductor memory device according to the first embodiment of the present invention.

A concrete configuration is described according to a detailed circuit diagram shown in FIG. 6. The memory device according to the first embodiment has a configuration in which the equalizing circuit 7 is eliminated from the conventional memory device shown in FIG. 3 and comprising the transistor N20 for equalizing the nodes $ND_1$ and $ND_3$ and the transistors N21 and P20 for equalizing the nodes $ND_2$ and $ND_4$, the reference potential decrease circuit 9 comprising N-channel enhancement type transistors N30 and N31 connected in series each other, and a third control signal $S_5$ is added to gates of the transistors P21 and N24 of the current mirror type amplifier circuit 10. A drain of the transistor N30 of the reference potential decrease circuit 9 is connected to the node $ND_3$, and a gate of the transistor N30 receives a control signal $*S_2$ which becomes from "H" to "L" after the constant time passes after the memory device becomes in an operation mode. The transistor N31 has a drain connected to a source of the transistor N30, a source being grounded to the earth, and a gate receiving a driving voltage $V_{CC}$. Accordingly, the reference potential decrease circuit 9 decreases the reference potential $V_R$ during the first predetermined time after changing the condition in the operation mode. The third control signal $S_5$, which is added to the gates of the transistors P21 and N24 of the current mirror type amplifier circuit 10, is a signal that changes from "H" to "L" after the constant time further passes after the signal $*S_2$ changes to "L".

Figure 1A:
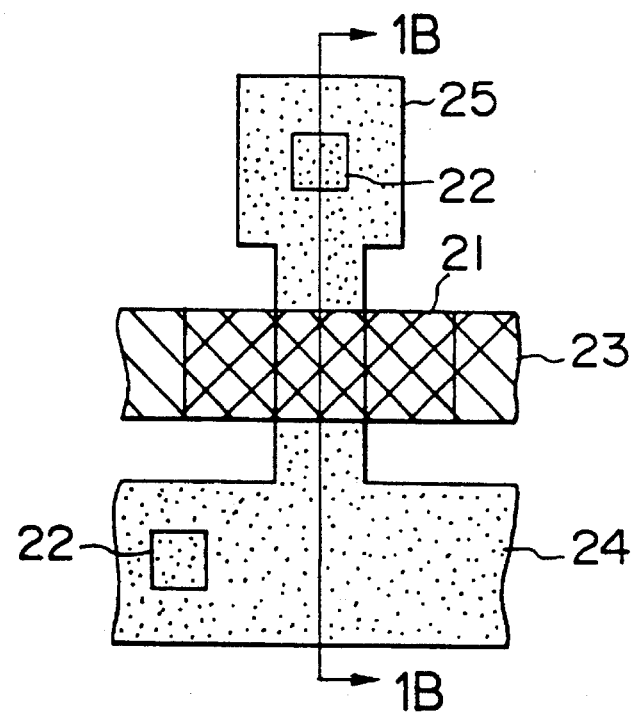
FIGS. 1A and 1B are a plan view and a sectional view for schematically explaining a construction of a nonvolatile transistor.
Figure 1B:
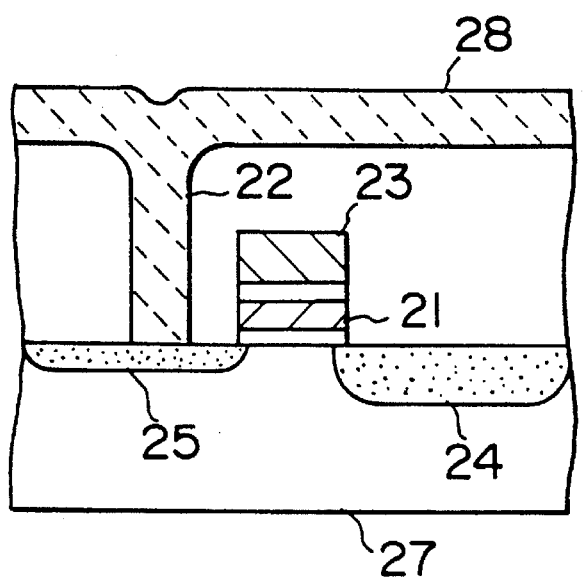
Figure 7:
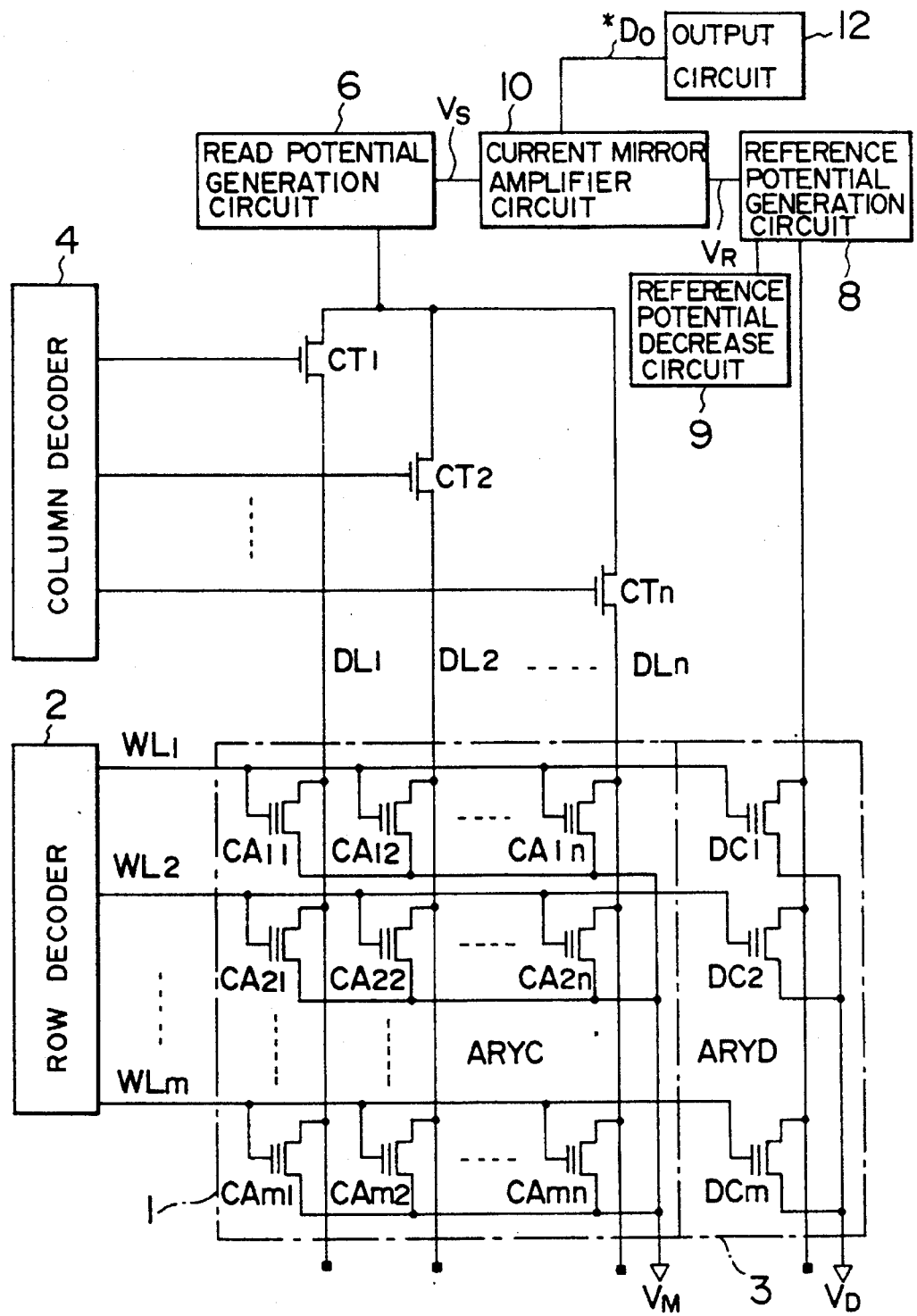
FIG. 7 is a block diagram showing a concrete configuration of the nonvolatile semiconductor memory device according to the first embodiment of the present invention.

FIG. 7 shows a configuration of the nonvolatile semiconductor memory device having as memory cells the nonvolatile transistors having the above construction. In FIG. 7, a memory cell array 1 comprises a plurality (m.n) of memory cells CA11, ..., CAmn which are arranged in a matrix. Each memory cell CAij (i=1, ..., m, j=1, ..., n), as shown in FIGS. 1A and 1B, is a nonvolatile transistor comprised of a source, a drain, a floating gate and a control gate. Control gates of memory cells CAk1, ..., CAkn of an n number arranged along the same row (such as k-th row) are commonly connected to a corresponding word line WLk within an m number of word lines WL1, ..., WLm. Drains of mmory cells CA1j, ..., CAmj of an m number arranged along the same column (such as j-th column) are commonly connected to a corresponding data line DLj within an n number of data lines DL1, ..., DLn. To sources of memory cells CAij, a potential $V_M$ which is outputted from a cell source potential supply circuit and has a high potential at erasing the data and potential $V_{SS}$ except an erasing condition.

A selection of the m number of word lines WL1, ..., WLm is performed by a row decoder 2 which selects one word line corresponding to a row address. On the other hand, a selection of the n number of data lines DL1, ..., DLn is performed by a column decoder 4. The column decoder 4 selects one data line corresponding to the column address by selecting a transfer gate CTj connected to the data line DLj (j=1, ..., n). Namely, the data line is selected by turning on only a transder gate connected to the data line corresponding to the column address. Each data line DLj (j=1, ..., n) is connected to the read potential generation circuit 6 through the corresponding transfer gate CTj. The read potential generation circuit 6 supplies a predetermined potential (for example, 1 V in the memory cell comprised of the transistor shown in FIGS. 1A and 1B) to a drain of the selected memory cell at reading the data, and generates the read potential $V_S$ corresponding to the cell current of the selected memory cell. The read potential $V_S$ is transmitted to the current mirror amplifier circuit 10 as input potential corresponding to the values "1" and "0" of the cell data, respectively.

On the other hand, the dummy cell array 3 comprises a m number of dummy cells DC1, ..., DCm. The dummy cell DCi (i=1, ..., m) is a nonvolatile transistor having the same construction as the memory cell CAij, and has a control gate connected to the corresponding word line WLi, a drain connected to a dummy data line $DL_R$, and a source receiving a potential $V_D$. The dummy data line $DL_R$ is connected to the reference potential generation circuit 8. The reference potential generation circuit 8 supplies a predetermined drain current to the drain of the selected dummy cell at reading the data through the data line $DL_R$, and transmits the reference potential $V_R$ at reading the data to the amplifier circuit 10. The amplifier circuit 10 compares the reference potential $V_R$ and the read potential $V_S$ so as to output a potential corresponding to the data of the selected memory cell to an output circuit 12. The output circuit 12 outputs the data of the selected memory cell on the basis of the potential transmitted from the amplifier circuit 10.

Figure 8:
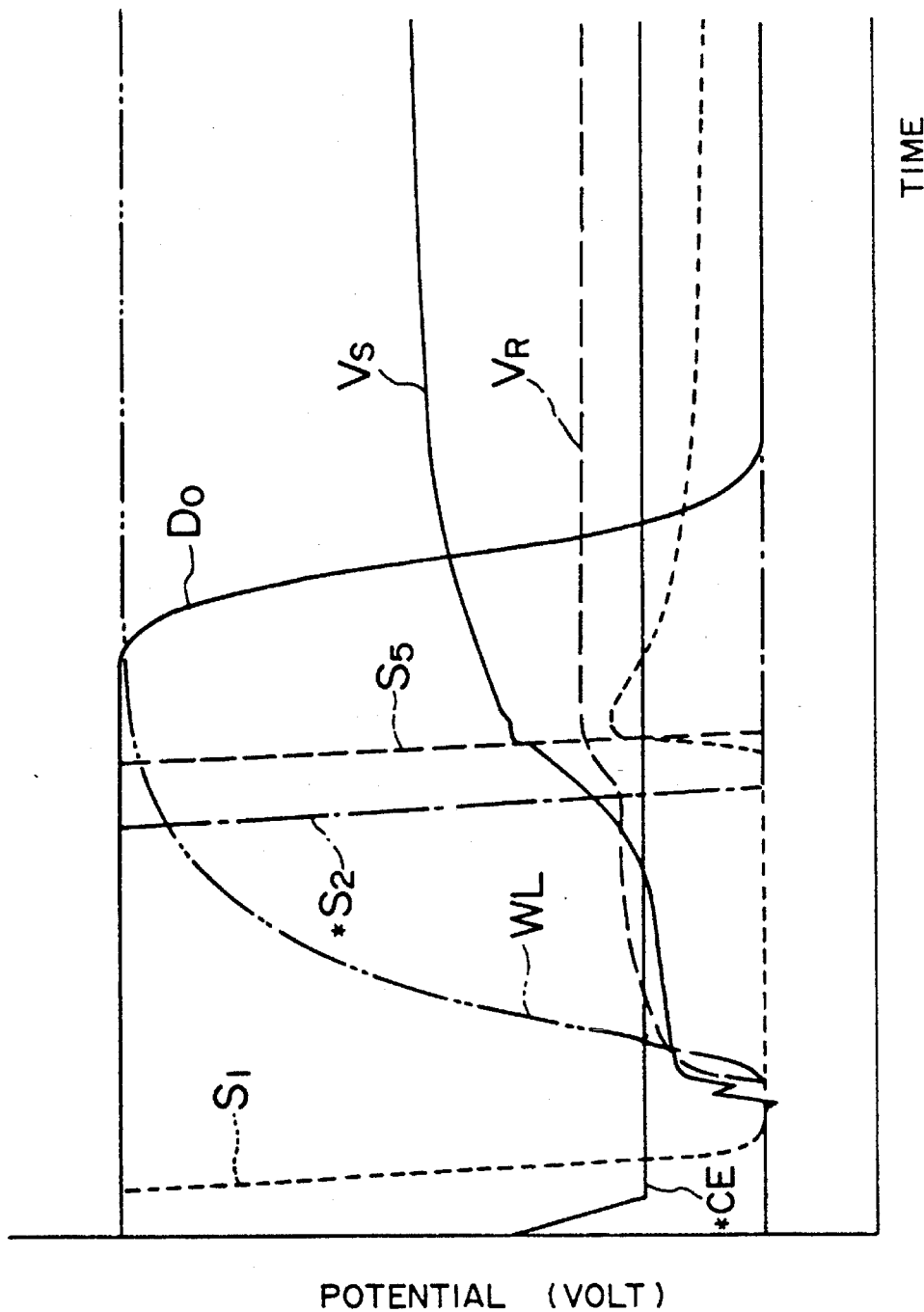
FIG. 8 is a timing chart for explaining operation of the nonvolatile semiconductor device according to the first embodiment.

Next, operation of the first embodiment is described in reference with FIG. 8. FIG. 8 is a waveform diagram showing operation at reading "0" data when the memory device of the first embodiment becomes in the operation mode. In FIG. 8, the signal *CE shows that the memory device becomes in the operation mode, for example, a chip enable signal. When the memory device receives the signal *CE, the first control signal $S_1$ for activating the memory device changes from "H" to "L" After that, the word line WL rises to select the memory cell. At this time, the load transistor N3 of the node $ND_1$ and the load transistor N13 of the node $ND_3$ respectively start a charge. Furthermore, the inverted signal $*S_2$ of the second control signal $S_2$ at this time is "H" level, and the level of the reference potential $V_R$ is reduced by the reference potential decrease circuit 9.

On the other hand, on the memory cell side, the data line $DL_S$ is charged by the load transistor P4. With the advance of the charge, a current amount decreases and the read potential $V_S$ increases to be higher than the level of the reference potential $V_R$. Here, when the signal $*S_2$ is caused to be from "H" to "L", the transistor N30 of the reference potential decrease circuit 9 is turned off, the reference potential $V_R$ is determined by the cell current of the dummy cell. After the difference between the reference potential $V_R$ and the read potential $v_S$ is sufficient to be large, the fifth control signal $S_5$ changes from "H" to "L", and the current mirror type amplifier circuit 10 is driven so as to issue an output $D_O$ at reading "0" data.

During the initial charging when the signal $*S_2$ is "H", the level of the reference potential $V_R$ is set to be higher than the read potential $V_S$ level at reading "1" data. Accordingly, since the levels of the reference potential $V_R$ and the read potential $V_S$ are not inverted at reading "1" data, a read of "1" data does not delay. The level of the reference potential $V_R$ at this time is determined by transistor N30 of the reference potential decrease circuit 9.

As described above, by the first embodiment of the present invention, it is possible to shorten the delay of data reading caused by the initial charge as small as possible when the memory device becomes from the standby mode to the operation mode, thereby performing a high-speed reading. Furthermore, since it is unnecessary to perform the equalization, a plurality of the read potential generation circuits can own the reference potential generation circuit jointly, thereby reducing the chip area as small as possible.

In the above first embodiment, even though an N-channel enhancement type transistor applies to the transistor N30 of the reference potential decrease circuit 9, a nonvolatile transistor as the same type as the memory cell CAij can be used as the transistor N30.

Furthermore, even though the control signal $*S_2$ is different from the control signal $S_5$ in the first embodiment, the signal $S_5$ is the same as the signal $*S_2$.

Still furthermore, even though the plurality of the dummy cells DCi are used corresponding to each word line WLi in the first embodiment, a provision of one dummy cell (both of the N-channel transistor and the nonvolatile transistor may be used) results the same effect.

Figure 10:
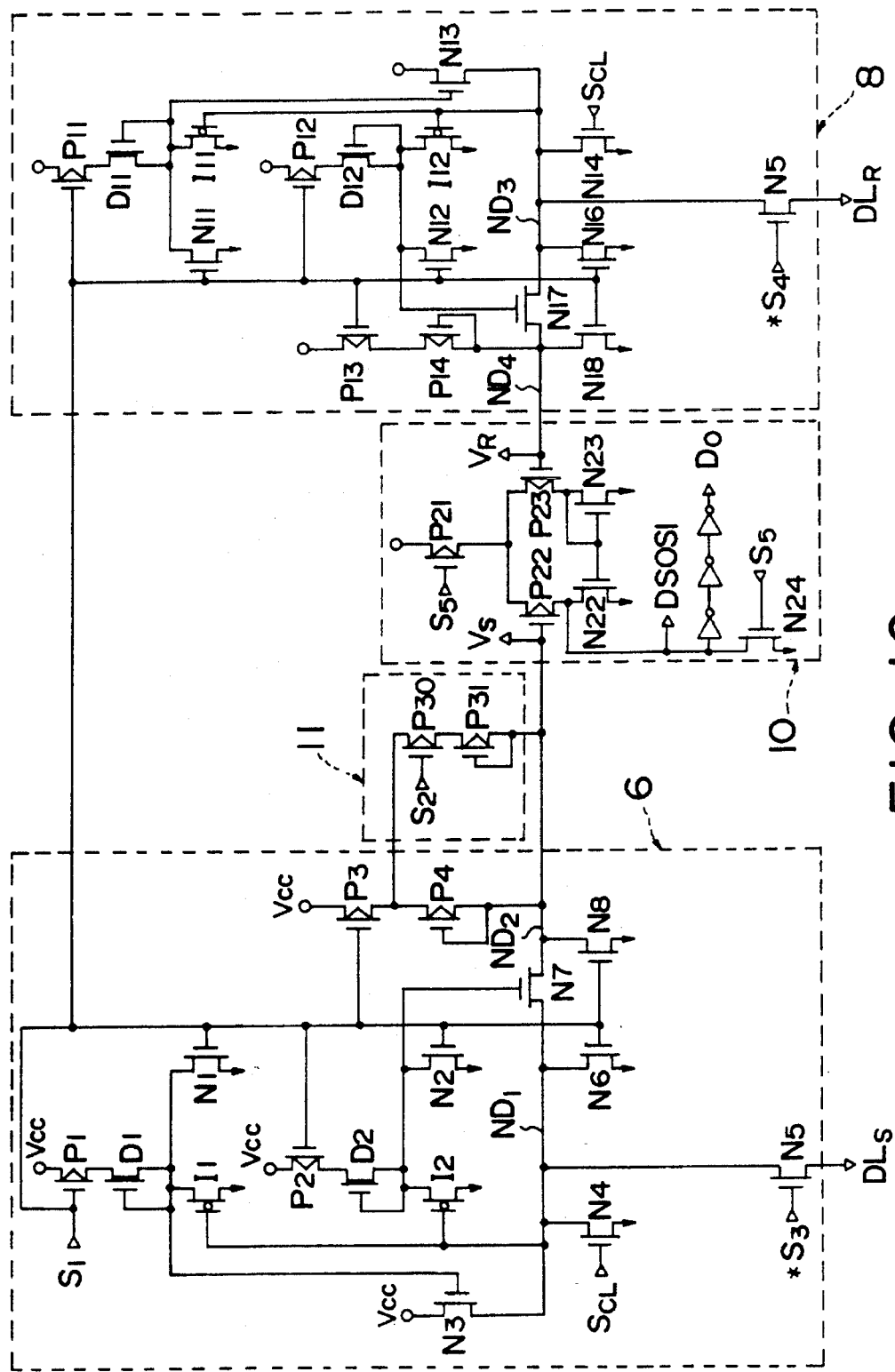
FIG. 10 is a circuit diagram showing a detailed configuration of the nonvolatile semiconductor memory device according to the second embodiment of the present invention.
Figure 11:
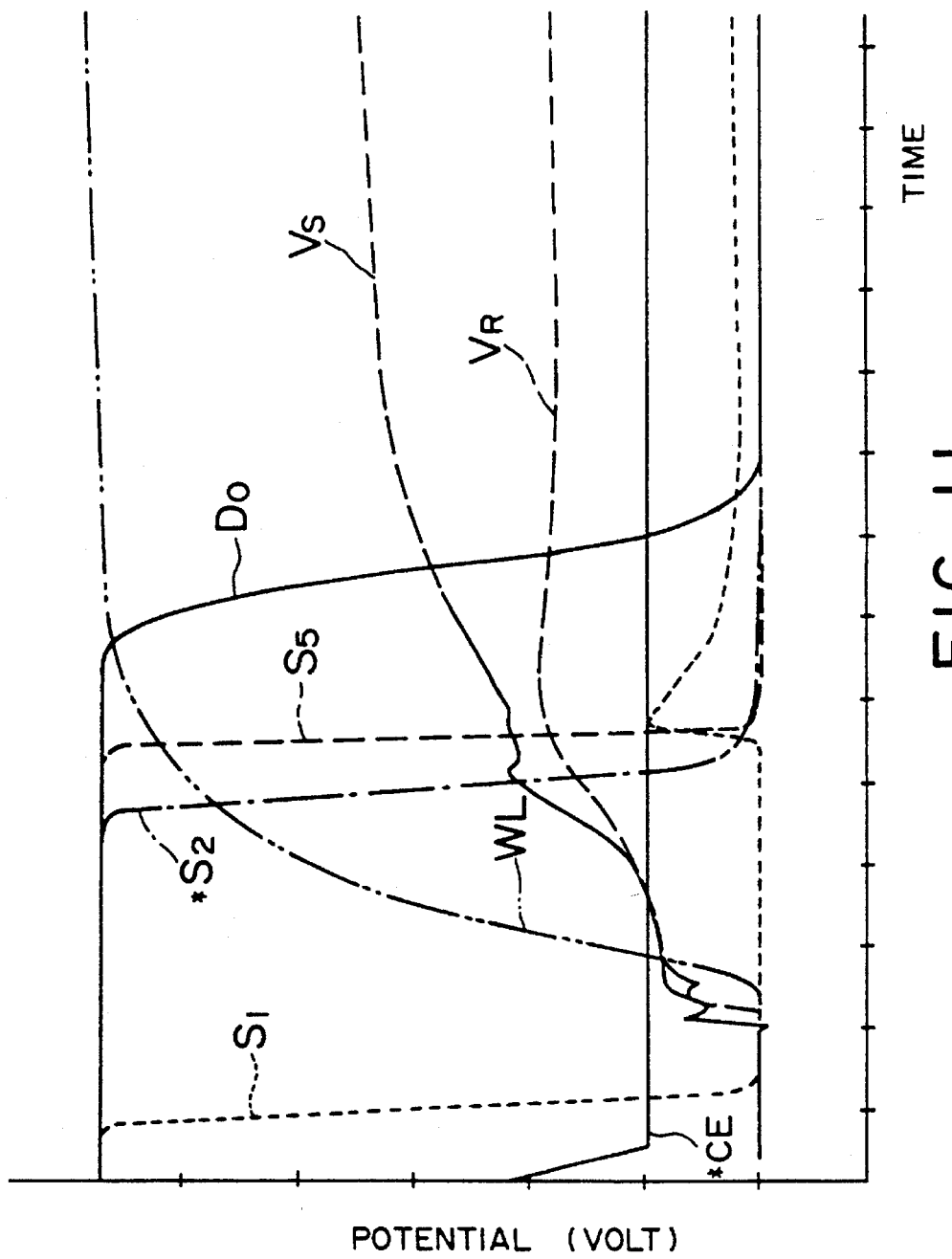
FIG. 11 is a timing chart for explaining operation of the nonvolatile semiconductor device according to the second embodiment of the present invention.

Next, a memory device according to the second embodiment of the present invention is described with reference to FIGS. 9–11.

Figure 9:
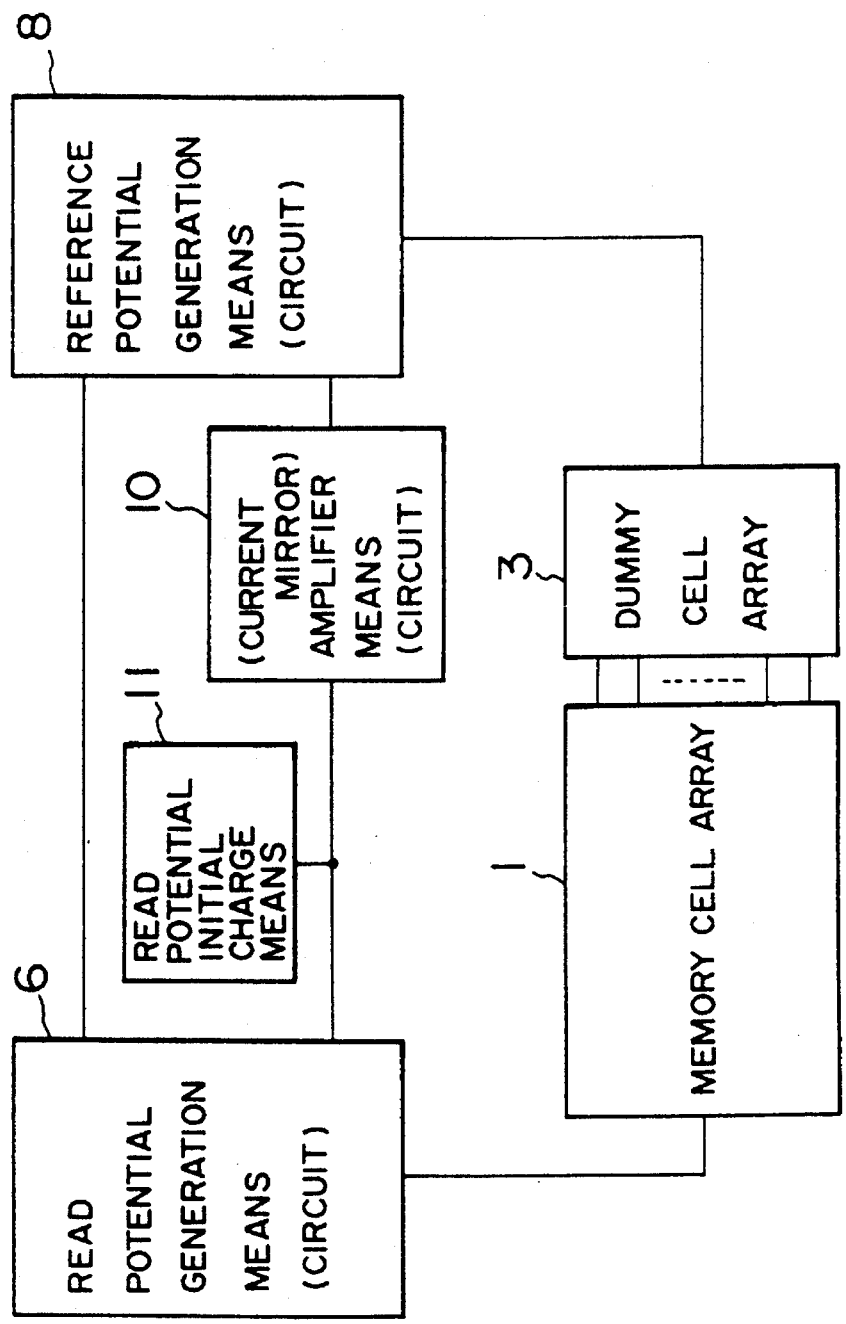
FIG. 9 is a block diagram showing a schematic configuration of a nonvolatile semiconductor memory device according to a second embodiment of the present invention.

The memory device according to the second embodiment, as shown in a block diagram of FIG. 9, read potential initial charge means 11 is added to the conventional memory device shown in the block diagram of FIG. 2, which is connected in parallel between the read potential generation circuit 8 and the current mirror type amplifier circuit 10. Other components are the same as the conventional memory device which has such as the memory cell array 1, dummy cell array 3, read potential generation circuit 6, reference potential generation circuit 8 and current mirror type amplifier circuit 10.

Next, there will be described a concrete configuration according to a detailed circuit diagram shown in FIG. 10. The second embodiment eliminates the transistors $N_{20}$, $N_{21}$ and P20 for equalizing the nodes $ND_1$ and $ND_3$ and the nodes $ND_2$ and $ND_4$ in the conventional memory device shown in FIG. 3, adds a read potential initial charge circuit 11 comprised of P-channel enhancement transistors P30 and P31 connected in series each other, and supplies the control signal $S_5$ to gates of the transistors P21 and P24 of the current mirror type amplifier circuit 10. In the read potential initial charge circuit 11, a drain and a gate of the transistor P31 are connected to the node $ND_2$, a drain of the transistor P30 is connected to a source of the transistor P31, and a gate of the transistor P30 receives the control signal $S_2$ changing to "H" after passing the predetermined time after the memory device becomes the operation mode. A source of the transistor P30 is connected to the drain of the transistor P3 and the source of the transistor P4. Accordingly, the read potential initial charge circuit 11 receives a charge of the read potential $V_S$ from not only the transistors P3 and P4 but also the transistors P30 and P31 during the constant time after the memory device changes from the standby mode to the operation mode.

Accordingly, the transistors P4 and P31 become the load transistor having the read potential when the signal $S_2$ is "L", and only the transistor P4 becomes the load transistor when the signal becomes to "H". At this time, the transistor size including the load transistors P4 and P31 is set to have a current amount as the same as or less than that of the load transistor P14 of the reference potential $V_R$. The signal $S_5$, which is supplied to the gates of the transistors P21 and N24 of the current mirror type amplifier circuit 10, is a signal which becomes "L" after the signal $S_2$ changes to "H" and still more after the predetermined time passes.

Next, operation of the second embodiment is described with reference to FIG. 11 which is a waveform diagram showing operation at reading "0" data when the memory device of the second embodiment becomes the operation mode. In FIG. 11, the signal $*CE$ is a signal showing that the memory device becomes the operation mode, for example, chip enable signal. When the memory device receives the signal $*CE$, the signal $S_1$ for activating the memory device changes from "H" to "L". After that, the word line WL rises to select the memory cell. At this time, the load transistor N3 of the node $ND_1$ and the load transistor N13 of the node $ND_3$ start the initial charge, respectively. The node $ND_4$ is set to the reference potential $V_R$ by the load transistor P14. Furthermore, the node $ND_2$ is rapidly charged by the load transistors P4 and P31. At this time, since the current for the initial charge to the data line flows, the read potential is first lower than the level of the reference potential $V_R$. However, when the charge advances, the current amount decreases to cause the read potential to be higher than the level of the reference potential $V_R$. Here, when the signal $S_2$ is caused to be changed from "L" to "H", the transistor P30 of the read potential initial charge circuit 11 is turned off so as to stop the charge from the load transistor P31, so that the charge is performed by only the transistor P4 to continue the charge to the level of the read potential. The charge is continued to be the levels of the reference potential $V_R$ and read potential $V_S$. After the difference between the reference potential $V_R$ and read potential $V_S$ becomes sufficiently, the signal $S_5$ changes from "H" to "L" to drive the current mirror type amplifier circuit 10 which issues the output $D_0$, that is "H", at reading "0" data.

When the data "1" is read, the reference potential $V_R$ does not become higher than the reference potential $V_R$ and the read of the data "1" does not delay because there is a current proportion between the load transistors P3 and P31 having the read potential and the load transistor P14 on the reference potential side.

As described in detail, the second embodiment can shorten the delay of reading caused by the initial charge to the data line when the memory device becomes the operation mode, thereby performing a high-speed reading of the data. Furthermore, since it is unnecessary to perform the equalization, it is possible to commonly use the reference potential generation circuit 8 by a plurality of read potential generation circuits 6, thereby extremely reducing the chip area.

Next, there will be described in detail a nonvolatile semiconductor memory device according to a third embodiment with reference to FIGS. 12–14.

Figure 12:
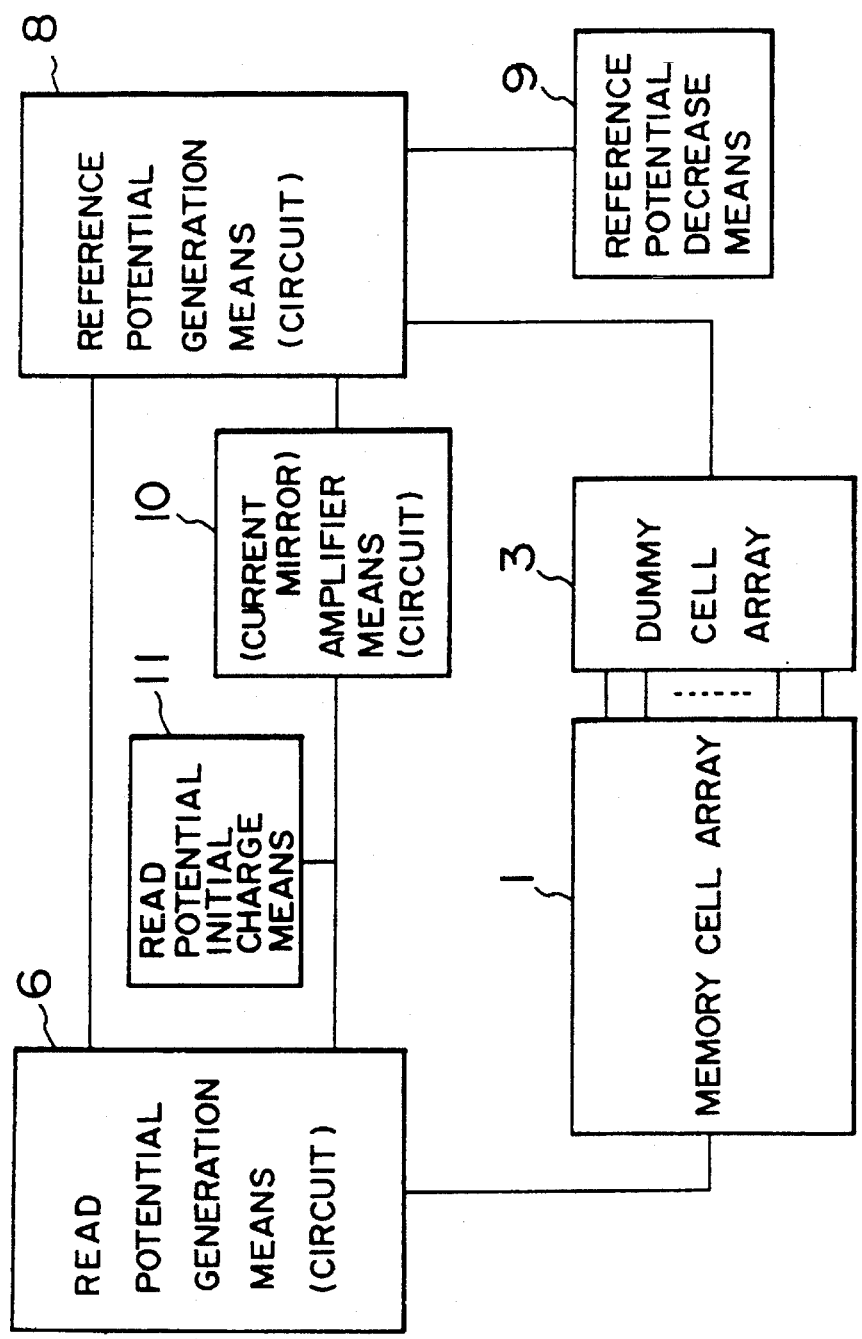
FIG. 12 is a block diagram showing a schematic configuration of a nonvolatile semiconductor memory device according to a third embodiment of the present invention.

FIG. 12 is a block diagram showing a schematic construction of the memory device according to the third embodiment. The different point between memory devices respectively shown in FIGS. 2 and 12 is that the reference potential decrease means 9 is connected to the reference potential generation circuit 8, and the read potential initial charge means 11 is connected in parallel between the read potential generation circuit 6 and amplifier circuit 10. Accordingly, the memory device of the third embodiment combines the features of the memory devices of the first and second embodiments. Other components are the same as those of the conventional memory device shown in FIG. 2, such as the memory cell array 1, dummy cell array 3, read potential generation circuit 6, reference potential generation circuit 8 and current mirror type amplifier circuit 10.

Figure 13:
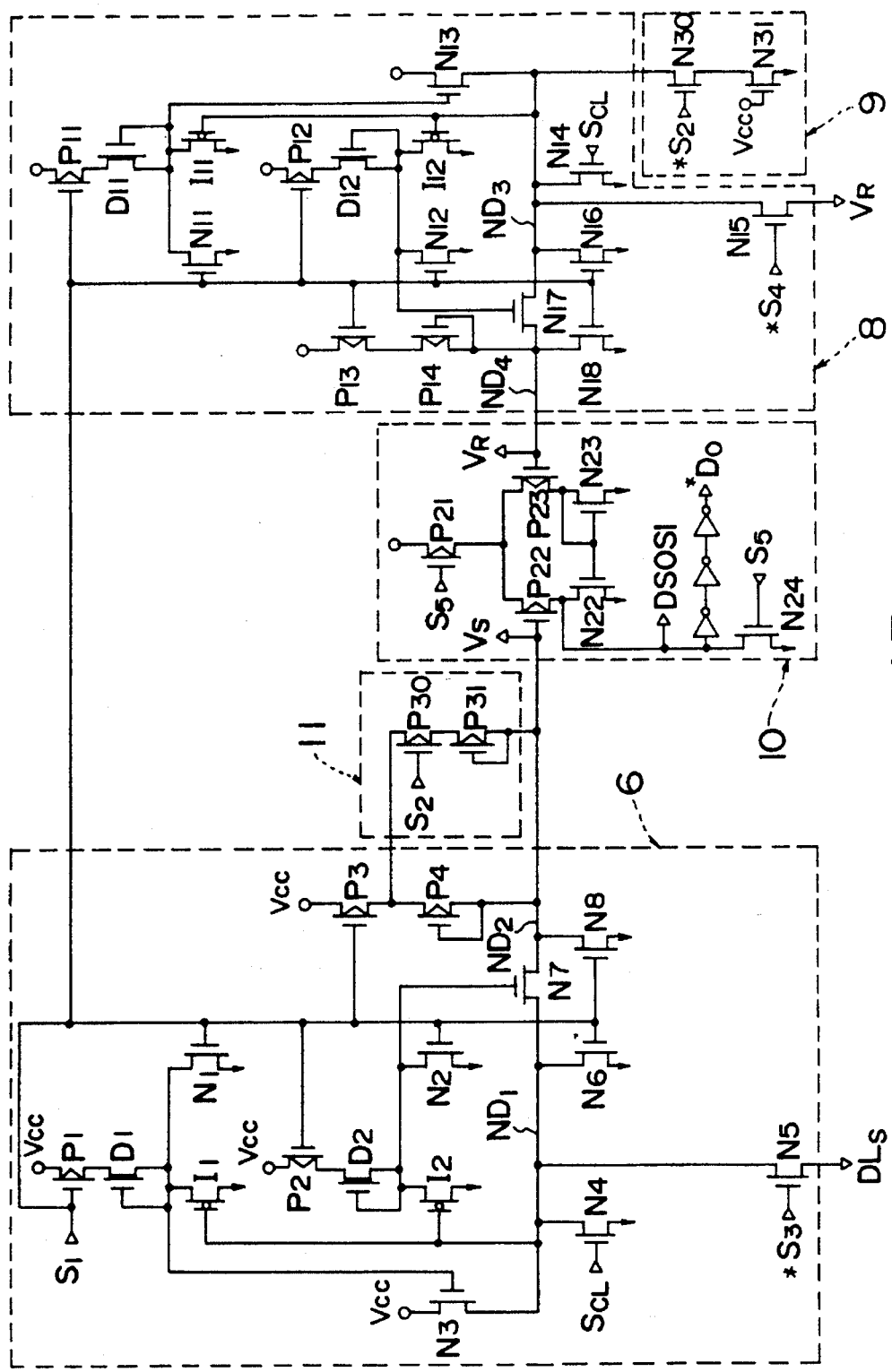
FIG. 13 is a circuit diagram showing a detailed configuration of the nonvolatile semiconductor memory device according to the third embodiment of the present invention.
Figure 14:
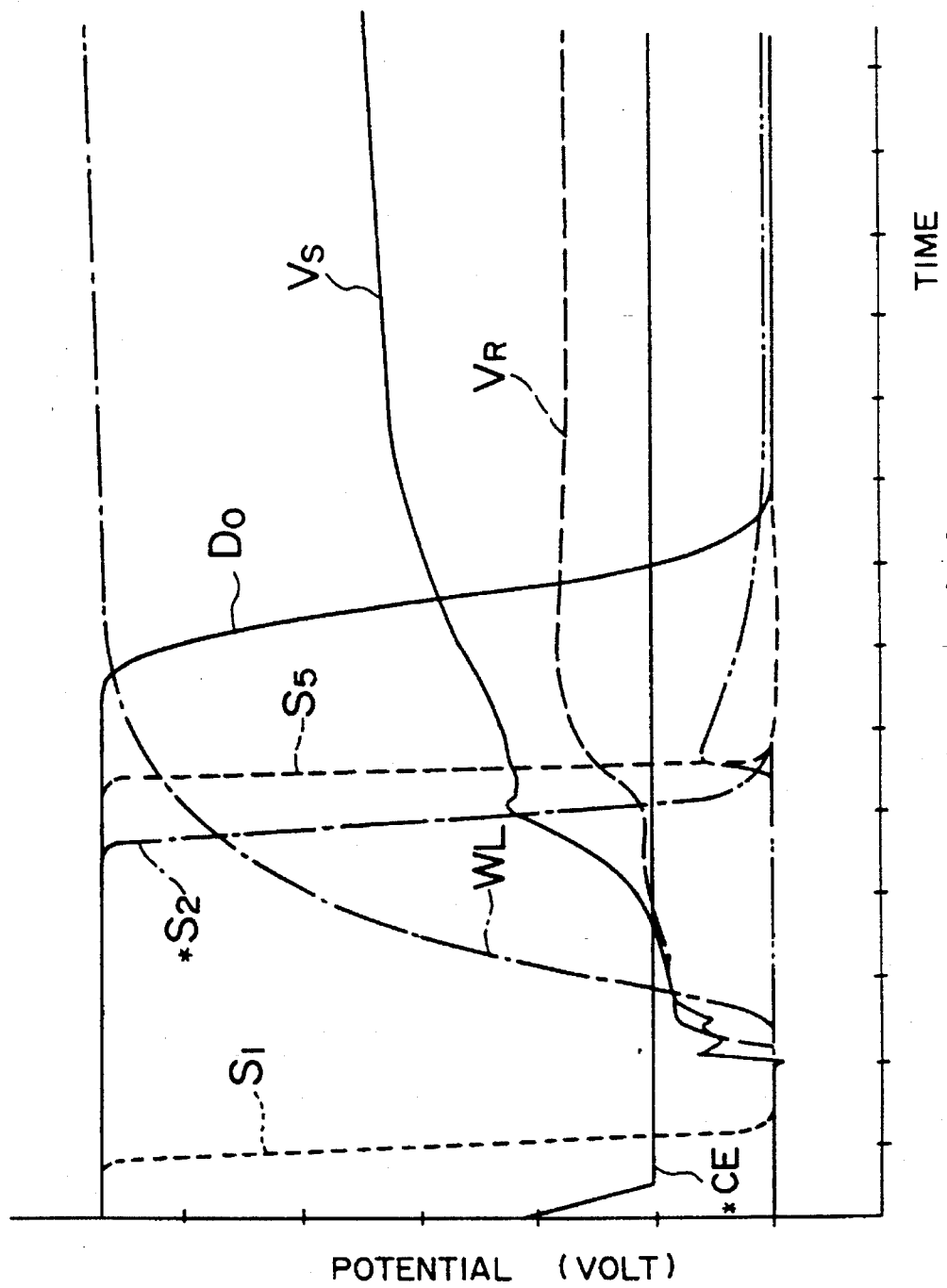
FIG. 14 is a timing chart for explaining operation of the nonvolatile semiconductor device according to the third embodiment of the present invention.

FIG. 13 shows a concrete configuration of the memory device according to the third embodiment. As shown in FIG. 13, the concrete circuit of the memory device of the third embodiment has the reference potential decrease circuit 9 comprised of the N-channel enhancement transistors N30 and N31 which are connected in series to the node $ND_3$, the circuit 9 which is added to the memory device according to the second embodiment. The transistor N30 of the reference potential generation circuit 9 has a drain connected to the node $ND_3$ of the reference potential generation circuit 8, and a gate supplied with the signal $*S_2$ which is converted from the signal $S_2$ and becomes to "L" after a constant time passes after the memory device becomes in the operation mode. The transistor N31 has a drain connected to a source of the transistor N30, a source grounded to the earth, and a gate added with the driving voltage $V_{CC}$. Accordingly, the reference potential decrease circuit 9 reduces the reference potential $V_R$ for a predetermined time period after the memory device changes in the operation mode.

Next, operation of the third embodiment is described with reference to FIG. 14. In FIG. 14, the read potential for reading the data of "0" level is rapidly charged by the transistors P4 and P31 in the same manner as the second embodiment after the memory device changes in the operation mode and until the predetermined time passes ($S_2$="L"). At this time, since the reference potential decrease circuit 9 reduces the level of the reference potential $V_R$ during the condition of $*S_2$="H", it is possible to charge in high-speed the read potential at reading the data of the level "0" to the reference potential $V_R$.

The above-mentioned memory devices according to three embodiment from first to third have the premise that the memory cell array 1 and dummy cell array 3 are provided for a pair as shown in FIG. 7. However, the present invention is not limited in the configuration, and a plurality of pairs including the memory cell arrays 1 and dummy cell arrays 3. Namely, FIGS. 15–17 shows memory devices according to fourth through sixth embodiment corresponding to the first through third embodiments.

Figure 15:
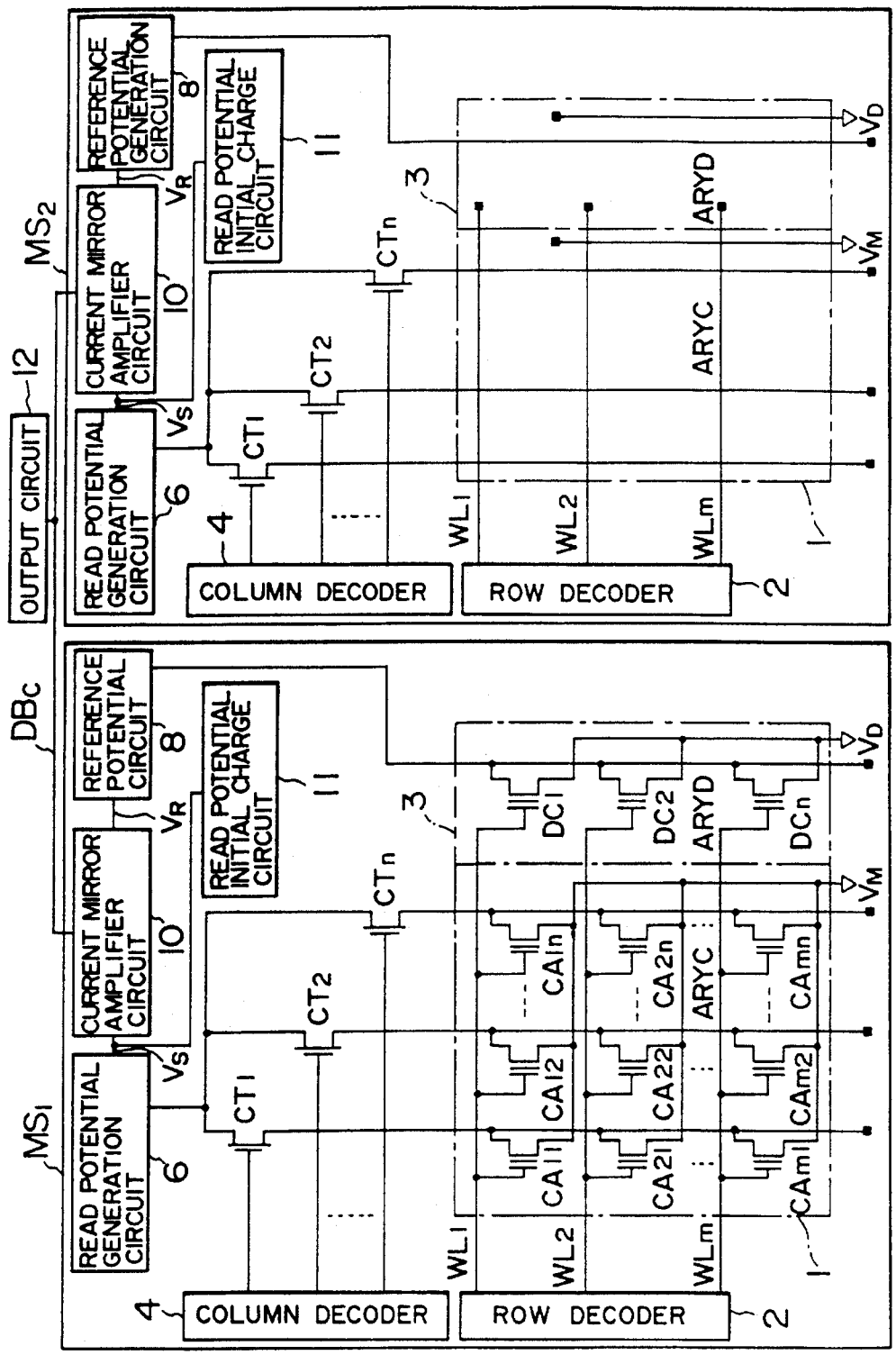
FIG. 15 is a block diagram showing a concrete configuration of a nonvolatile semiconductor memory device according to a fourth embodiment of the present invention.
Figure 16:
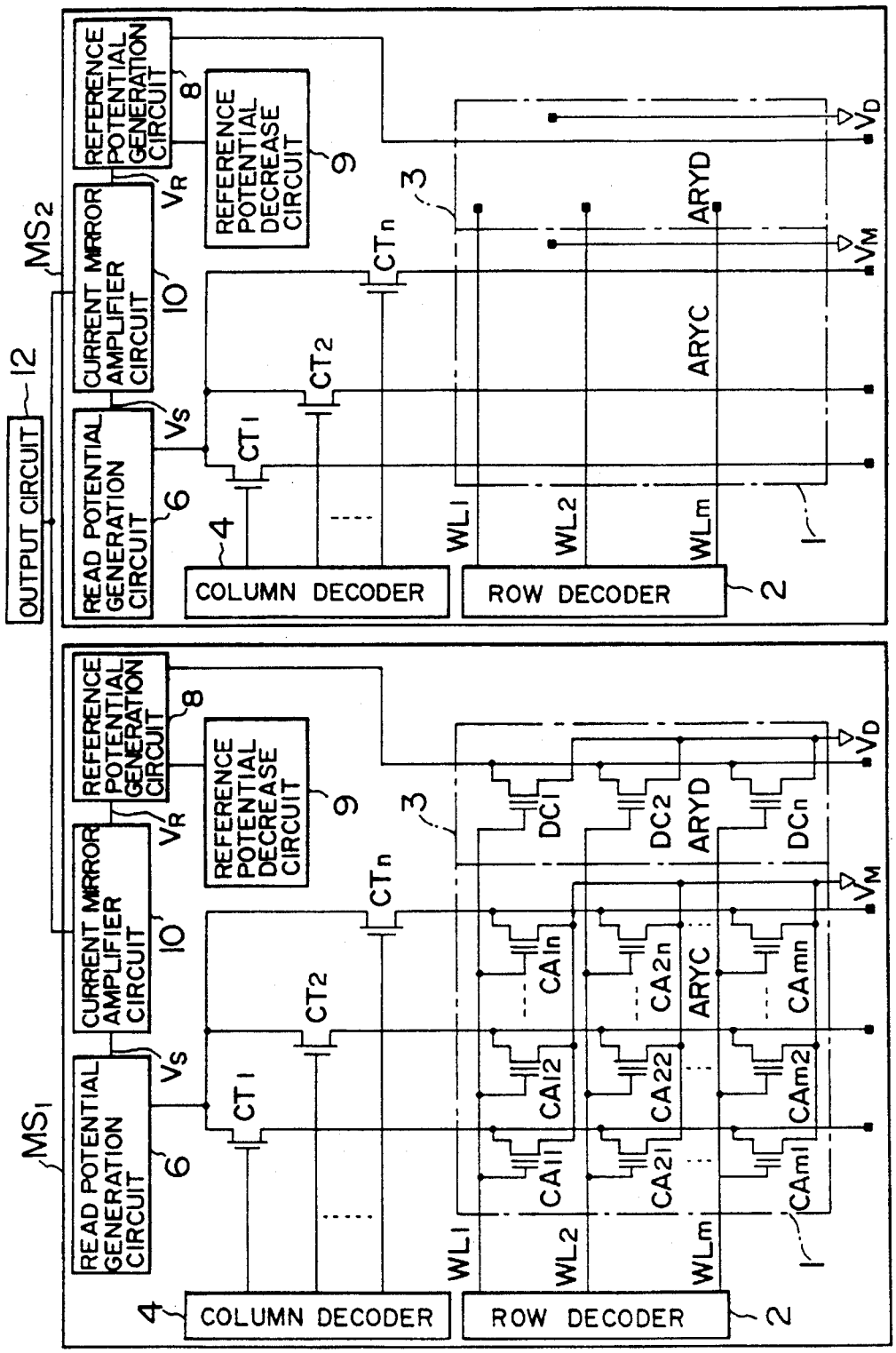
FIG. 16 is a block diagram showing a concrete configuration of a nonvolatile semiconductor memory device according to a fifth embodiment of the present invention.
Figure 17:
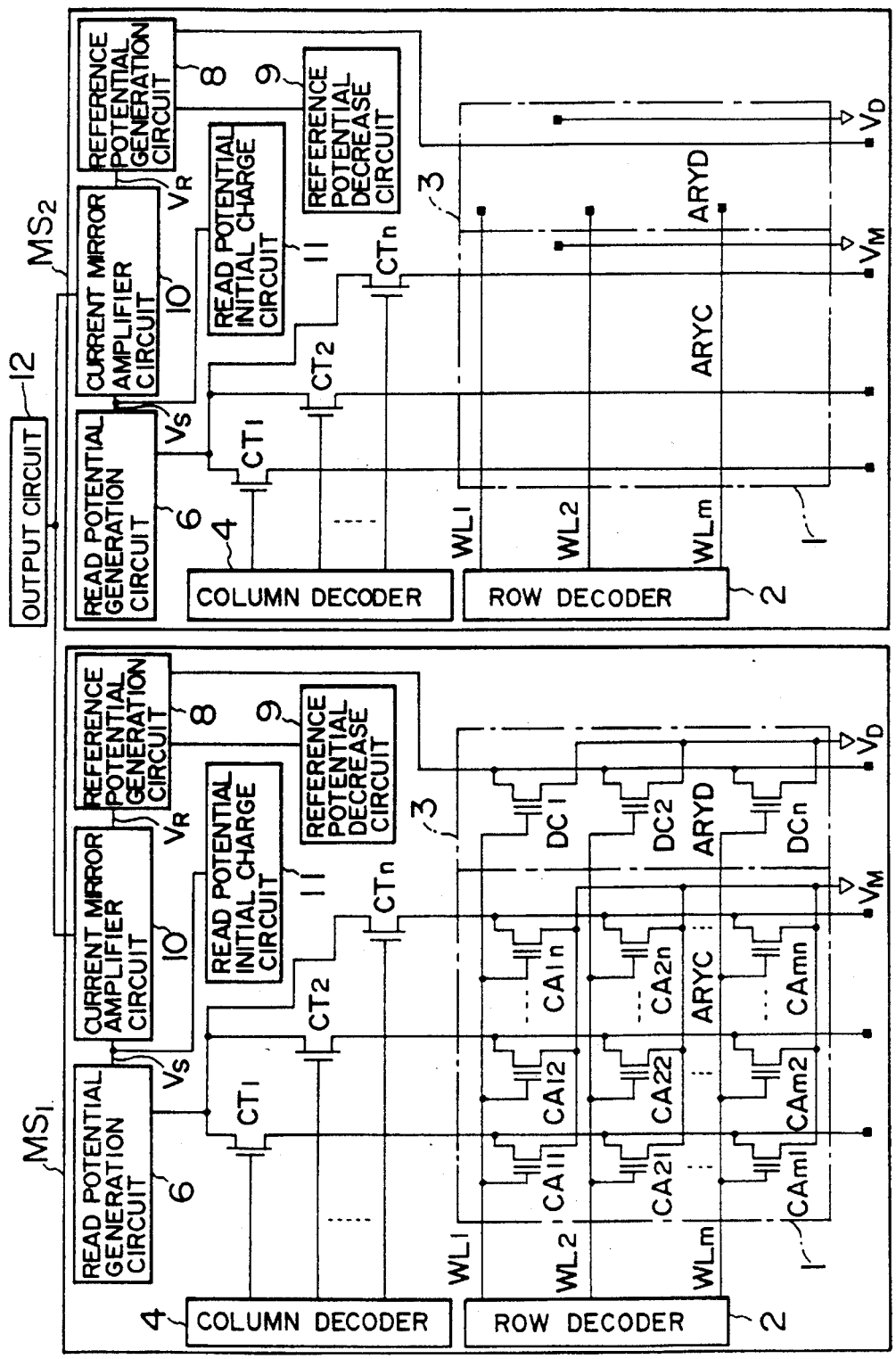
FIG. 17 is a block diagram showing a concrete configuration of a nonvolatile semiconductor memory device according to a sixth embodiment of the present invention.

In FIGS. 15–17, the memory devices according to the fourth to sixth embodiments have the configuration in which the memory cell array 1 and dummy cell array 3 shown in FIG. 7 are respectively divided into a plurality of arrays 1 and 3, such as two pairs. Furthermore, the memory device comprises a plurality of row decoders 2, column decoders 4, read potential generation circuits 6, reference potential generation circuits 8, current mirror type amplifier circuits 10, word lines $WL_1$, $WL_2$, and transfer gates CT1, CT2, ..., CTn, and each of them comprises memory sections $MS_1$ and $MS_2$, respectively. In each circuit in such a memory device, only a circuit in the section such as the memory section $MS_1$ is activated by determination, for example, by a section address. At this time, the current mirror type amplifier circuit 10 in the memory section $MS_1$ compares an output $V_S$ of the read potential generation circuit 6 with an output $V_R$ of the reference potential generation circuit 8, so as to output the data of the selected memory cell to the common data bus $DB_C$. Furthermore, at this time, the other memory section $MS_2$ is in a standby mode. Therefore, when the memory section selected by the section address changes from $MS_1$ to $MS_2$, each circuit in the section $MS_2$ changes from the standby mode to the operation mode, thereby starting the same operation as the circuit shown in the first, second or third embodiment. Accordingly, it may be clearly understood that high-speed reading can be performed.

As described above, the present invention can prevent the increase of the chip area as small as possible, and high-speed reading can be performed when the memory device changes from the standby mode to the operation mode.

What is claimed is:

1. A nonvolatile memory device capable of reading data when a standby mode changes to an operation mode, comprising:

a memory cell array having a matrix of memory cells comprising transistors;

a dummy cell comprising a transistor;

read potential generation means for supplying a predetermined potential to a selected memory cell and for generating a read potential corresponding to data stored in said selected memory cell on the basis of a current flowing in said selected memory cell;

reference potential generation means for supplying a predetermined potential to said dummy cell and for generating a reference potential on the basis of a current flowing in said dummy cell;

reference potential decrease means for decreasing said reference potential for a first predetermined time period after said memory device changes from said standby mode to said operation mode, said reference potential decrease means causing said reference potential to decrease with respect to said read potential so that said read potential is greater than said reference potential; and an amplifier coupled to said read potential generation means and to said reference potential generation means, said amplifier comparing said read potential and said reference potential after a second predetermined time period after said memory device changes from the standby mode to the operation mode, wherein said amplifier outputs a signal derived from said comparison.

2. The nonvolatile memory device according to claim 1, wherein said dummy cell is one cell of an array of dummy cells having a column in which a plurality of transistors are arranged so that a one of said plurality of transistors is provided at each row of said memory cell array.

3. The nonvolatile memory device according to claim 1, wherein said amplifier is driven to an activated condition after said second predetermined time period.

4. The nonvolatile memory device according to claim 1, wherein said first and second predetermined time periods are of equal length.

5. A nonvolatile semiconductor memory device capable of reading data when a standby mode changes to an operation mode, comprising:

a memory cell array having a matrix of memory cells comprising transistors;

a dummy cell comprising a transistor;

read potential generation means for supplying a predetermined potential to a selected memory cell and for generating a read potential corresponding to data stored in said selected memory cell on the basis of a current flowing in said selected memory cell;

reference potential generation means for supplying a predetermined potential to said dummy cell and for generating a reference potential on the basis of a current flowing in the dummy cell;

read potential initial charge means for increasing the read potential for a first predetermined time period after said memory device changes from said standby mode to said operation mode, said read potential initial charge means causing said read potential to increase with respect to said reference potential so that said read potential is greater than said reference potential; and an amplifier coupled to said read potential generation means and to said reference potential generation means, said amplifier comparing said read potential and said reference potential after a second predetermined time period after said memory device changes from the standby mode to the operation mode wherein said amplifier outputs a signal derived from said comparison.

6. The nonvolatile semiconductor memory device according to claim 5, further comprising a plurality of memory sections each having a corresponding memory cell array, a corresponding read potential generation means, a corresponding reference potential generation means, a corresponding read potential initial charge means, and a corresponding amplifier; wherein said memory cell array, said read potential generation means, said reference potential generation means, said read potential initial charge means and said amplifier corresponding to a one of said plurality of memory sections are in said operation mode only when said one of said plurality of memory sections is in said operation mode.

7. The nonvolatile semiconductor memory device according to claim 5, wherein said amplifier is driven to an activated condition after said second predetermined time period.

8. The nonvolatile semiconductor memory device according to claim 5, wherein said first predetermined time period and said second predetermined time period are of equal length.

9. A nonvolatile semiconductor memory device capable of reading data when a standby mode changes to an operation mode, comprising:

a memory cell array having a matrix of memory cells comprising transistors;

a dummy cell comprising a transistor;

read potential generation means for supplying a predetermined potential to a selected memory cell and for generating a read potential corresponding to data stored in said selected memory cell on the basis of a current flowing in said selected memory cell;

reference potential generation means for supplying a predetermined potential to said dummy cell and for generating a reference potential on the basis of a current flowing in said dummy cell;

reference potential decrease means for decreasing said reference potential for a first predetermined time period after said memory device changes from said standby mode to said operation mode, said reference potential decrease means causing said reference potential to decrease with respect to said read potential so that said read potential is greater than said reference potential;

read potential initial charge means for increasing the read potential for said first predetermined time period after said memory device changes from said standby mode to said operation mode; and an amplifier coupled to said read potential generation means and to said reference potential generation means, said amplifier comparing said read potential and said reference potential after a second predetermined time period after said memory device changes from the standby mode to the operation mode, wherein said amplifier outputs a signal derived from said comparison.

10. The nonvolatile semiconductor memory device according to claim 9, wherein said first predetermined time period and said second predetermined time period are of equal length.

* * * * *